(12) United States Patent
Martin et al.

(10) Patent No.: US 12,311,661 B2
(45) Date of Patent: May 27, 2025

(54) INTEGRATED CIRCUITS INCLUDING HIGH-VOLTAGE HIGH-POWER AND HIGH-VOLTAGE LOW-POWER SUPPLY NODES

(71) Applicant: Hewlett-Packard Development Company, L.P., Spring, TX (US)

(72) Inventors: Eric Thomas Martin, Corvallis, OR (US); James Michael Gardner, Corvallis, OR (US); Rogelio Cicili, Corvallis, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 18/572,767

(22) PCT Filed: Jul. 6, 2021

(86) PCT No.: PCT/US2021/040585
§ 371 (c)(1),
(2) Date: Dec. 20, 2023

(87) PCT Pub. No.: WO2023/282892
PCT Pub. Date: Jan. 12, 2023

(65) Prior Publication Data
US 2024/0286402 A1 Aug. 29, 2024

(51) Int. Cl.
*B41J 2/045* (2006.01)
*G11C 5/14* (2006.01)
(52) U.S. Cl.
CPC ........... *B41J 2/04548* (2013.01); *G11C 5/147* (2013.01)

(58) Field of Classification Search
CPC .. B41J 2/04548; B41J 2/04541; B41J 2/0458; B41J 2/04521; B41J 2/0455; B41J 2/04543; B41J 2/04545; B41J 2/04546; B41J 2/04575; B41J 2/04576; B41J 2/04578; B41J 2/04581; B41J 2/04583; B41J 2/04585; B41J 2/04586; B41J 2/1753; B41J 2/17546; B41J 2002/14491; G11C 5/147
See application file for complete search history.

(56) References Cited

U.S. PATENT DOCUMENTS

| | | | |
|---|---|---|---|
| 10,232,610 B2 | 3/2019 | Anderson et al. |
| 10,589,522 B2 | 3/2020 | Linn et al. |
| 2012/0002499 A1 | 1/2012 | Kinkade et al. |
| 2015/0298457 A1 | 10/2015 | Ohmura |
| 2017/0243806 A1 | 8/2017 | Iyengar et al. |
| 2018/0236762 A1 | 8/2018 | Negishi et al. |

FOREIGN PATENT DOCUMENTS

WO 2020/162914 A1 8/2020

*Primary Examiner* — Kristal Feggins
(74) *Attorney, Agent, or Firm* — Foley & Lardner LLP

(57) ABSTRACT

An integrated circuit includes a plurality of fluid actuation devices, a plurality of memory cells, a high-voltage high-power supply node, and a high-voltage low-power supply node. The high-voltage high-power supply node is to supply a first voltage and a first maximum current to the plurality of fluid actuation devices. The high-voltage low-power supply node is to supply a second voltage and a second maximum current to the plurality of memory cells.

15 Claims, 5 Drawing Sheets

INTEGRATED CIRCUITS INCLUDING HIGH-VOLTAGE HIGH-POWER AND HIGH-VOLTAGE LOW-POWER SUPPLY NODES

CROSS-REFERENCE TO RELATED APPLICATIONS

This application is a U.S. National Stage Patent Application under 35 U.S.C. § 371 of PCT/US2021/040585, filed Jul. 6, 2021, which is hereby incorporated by reference in its entirety.

BACKGROUND

An inkjet printing system, as one example of a fluid ejection system, may include an integrated circuit, such as a fluidic die, an ink supply which supplies liquid ink to the fluidic die, and an electronic controller which controls the fluidic die. The fluidic die, as one example of a fluid ejection device, ejects drops of ink through a plurality of nozzles or orifices and toward a print medium, such as a sheet of paper, so as to print onto the print medium. In some examples, the orifices are arranged in a single column or array or multiple columns or arrays such that properly sequenced ejection of ink from the orifices causes characters or other images to be printed upon the print medium as the fluidic die and/or the print medium are moved relative to each other.

DETAILED DESCRIPTION

Figure 1A:
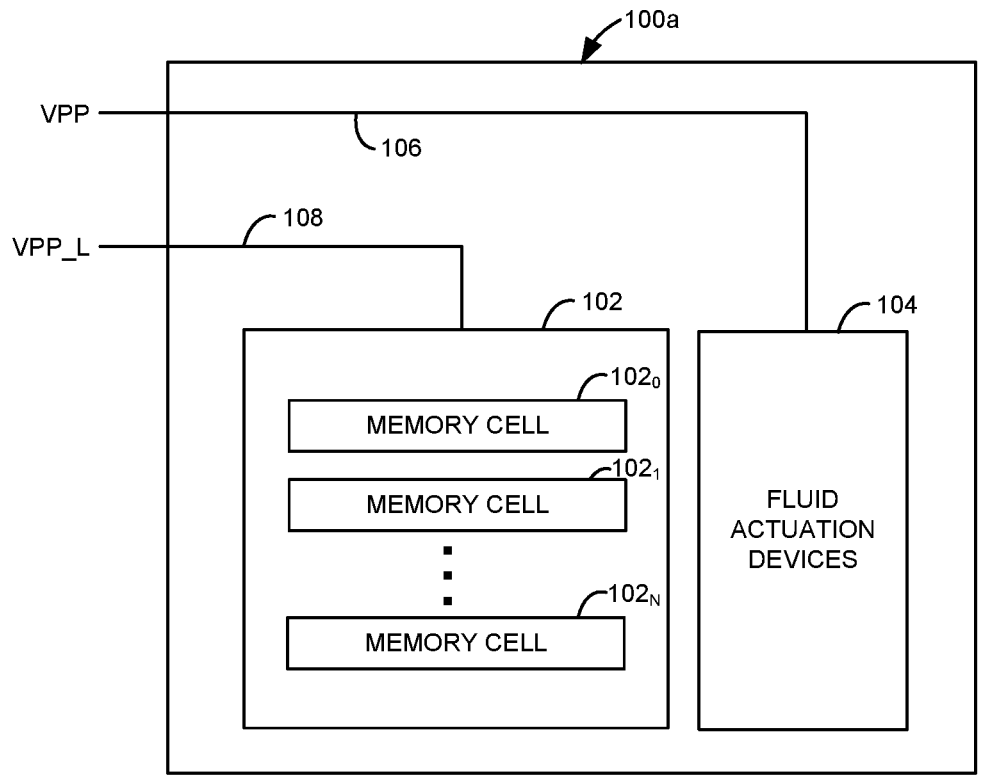
FIG. 1A is a block diagram illustrating one example of an integrated circuit including a plurality of memory cells and a plurality of fluid actuation devices.

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

An integrated circuit, such as a fluidic die, may include on-die non-volatile memory (NVM) bits (e.g., one-time programmable (OTP) NVM) to store information accumulated throughout the life of the fluidic die, such as manufacturing tracking data and in-product usage statistics (e.g., total pages printed, etc.). The NVM circuitry may use two unique voltages for read and write operations. Typically, both voltages are generated from a single high-voltage high-power supply using a voltage regulator. This high-voltage high-power supply used for NVM circuits may also be used to fire fluid actuation devices and for warming circuits of the fluidic die. Thus, the high-voltage high-power supply and the power supply node (e.g., bus) used to connect the high-voltage high-power supply to the NVM circuitry, fluid actuation devices, and warming circuits is needed to read the NVM bits. If the high-voltage high-power supply is disabled or the supply node used to connect the high-voltage high-power supply to the NVM circuitry is disabled for any reason, the NVM bits cannot be read. Unfortunately, the high-voltage high-power supply node may be prone to electrical damage (e.g., short circuit) due to failed fluid actuation devices and/or electrical overstress (EOS) events. If a failure of the high-voltage high-power supply node occurs, NVM data stored in the failed fluidic die may be inaccessible to failure analysis technicians or return centers. In some cases, a failed high-voltage high-power supply node may even damage NVM circuits or corrupt data stored in NVM cells. For commercial/industrial print businesses, the ability to efficiently diagnose fluidic dies that have been returned by customers is desirable. Proper diagnosis may include the ability to robustly read the NVM data.

Accordingly, disclosed herein are integrated circuits, such as fluidic dies, including fluid actuation devices and memory cells (e.g., non-volatile memory cells such as one-time-programmable memory cells). A first power supply, such as a high-voltage high-power supply may be used to power the fluid actuation devices. The first power supply may have a voltage within a range between about 10V and about 50V and a current within a range between about 1 A and about 10 A. For example, a 32V, 5 A DC power supply may be used to power the fluid actuation devices. A second power supply, such as a high-voltage low-power supply may be used to power the memory cells. The second power supply may have a voltage within a range between about 10V and about 50V and a current within a range between about 50 mA and about 200 mA. For example, a 32V, 50 mA DC power supply may be used to power the memory cells. A dual output voltage regulator circuit may be used to output a memory-write voltage (e.g., 11V) from the second power supply and a memory-read voltage (e.g., 5V) from the second power supply. The voltage regulator can generate the memory-read voltage and the memory-write voltage without the presence of the first power supply and/or with the high-voltage high-power supply node disabled. Thus, even if the fluidic die fails due to damage to the high-voltage high-power supply node, the memory cells may still be read. In addition, the risk of corruption of the data stored in the memory cells due to failure of the high-voltage high-power supply node of the fluidic die is reduced.

FIG. 1A is a block diagram illustrating one example of an integrated circuit 100a (e.g., a fluidic die). Integrated circuit 100a includes a plurality of memory cells 102, a plurality of fluid actuation devices 104, a high-voltage high-power supply node 106, and a high-voltage low-power supply node 108. The plurality of memory cells 102 includes memory cells $102_0$ to $102_N$, where "N" is any suitable number of memory cells. The high-voltage high-power supply node 106 is to supply a first voltage and a first maximum current to the plurality of fluid actuation devices 104. The high-voltage low-power supply node 108 is to supply a second voltage and a second maximum current to the plurality of memory cells 102. Integrated circuit 100a may include logic (not shown) for reading and/or writing to the plurality of memory cells 102.

The high-voltage high-power supply node 106 may be electrically coupled to a high-voltage high-power supply (e.g., VPP). The high-voltage low-power supply node 108 may be electrically coupled to a high-voltage low-power supply (e.g., VPP_L). In one example, the first voltage supplied on the high-voltage high-power supply node 106 and the second voltage supplied on the high-voltage low-power supply node 108 are greater than 10 volts (e.g., within a range between about 10V and about 50V, such as about 32V). In some examples, the first voltage supplied on the high-voltage high-power supply node 106 is within 10 percent of the second voltage supplied on the high-voltage low-power supply node 108. The first maximum current supplied on the high-voltage high-power supply node 106 is at least three times the second maximum current supplied on the high-voltage low-power supply node 108 (i.e., the first maximum current supplied on the high-voltage high-power supply node 106 is three times the second maximum current or more than three times the second maximum current supplied on the high-voltage low-power supply node 108). In one example, the first maximum current may be greater than about 1 A (e.g., within a range between about 1 A and about 10 A), and the second maximum current may be less than about 1 A (e.g., within a range between about 50 mA and about 200 mA). Since the high-voltage high-power supply node 106 is not used to supply power to the plurality of memory cells 102, the plurality of memory cells 102 are readable with the high-voltage high-power supply node 106 disabled (e.g., due to damage or other causes).

Figure 1B:
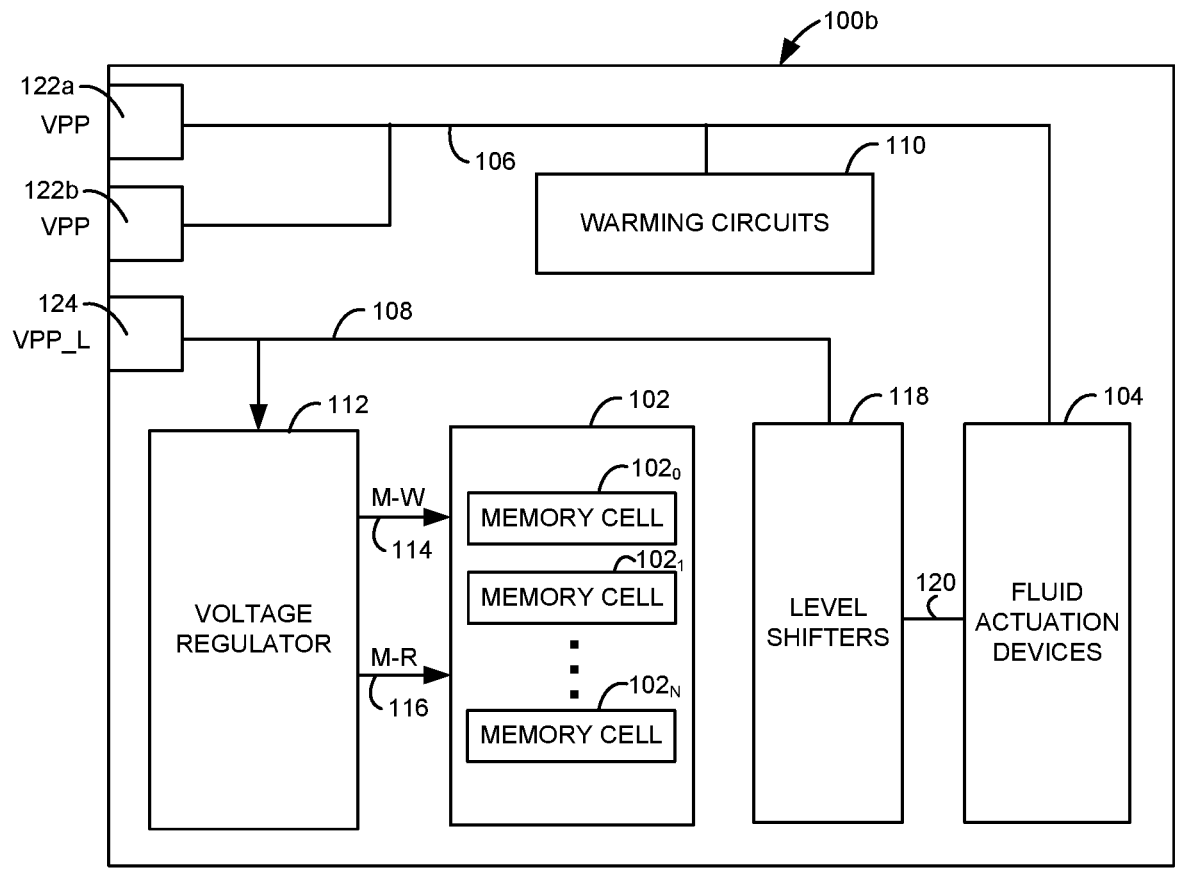
FIG. 1B is a block diagram illustrating another example of an integrated circuit including a plurality of memory cells and a plurality of fluid actuation devices.

FIG. 1B is a block diagram illustrating another example of an integrated circuit 100b (e.g., a fluidic die). Integrated circuit 100b includes the plurality of memory cells 102, the plurality of fluid actuation devices 104, the high-voltage high-power supply node 106, and the high-voltage low-power supply node 108 as previously described and illustrated with reference to FIG. 1A. In addition, integrated circuit 100b includes a plurality of warming circuits 110, a voltage regulator 112, a plurality of level shifters 118, a plurality of first interconnect pads 122a and 122b, and a second interconnect pad 124. The high-voltage high-power supply node 106 is to supply the first voltage to the plurality of warming circuits 110. The plurality of warming circuits 110 may be used to regulate the temperature across the integrated circuit 100b. The high-voltage low-power supply node 108 is to supply the second voltage to the voltage regulator 112 and the plurality of level shifters 118.

The voltage regulator 112 is electrically coupled to the plurality of memory cells 102 through a memory-write (M-W) signal path 114 and a memory-read (M-R) signal path 116. The voltage regulator 112 is to receive the second voltage supplied by the high-voltage low-power supply node 108 and generate a memory-write voltage on the M-W signal path 114 and a memory-read voltage on the M-R signal path 116. The memory-write voltage may be used to write data to the plurality of memory cells 102, and the memory-read voltage may be used to read data from the plurality of memory cells 102. The memory-write voltage may be greater than the memory-read voltage. In one example, the memory-write voltage may be about 11V, and the memory-read voltage may be about 5V. In other examples, the memory-write voltage and the memory-read voltage may have other suitable voltages less than the second voltage supplied by the high-voltage low-power supply node 108.

The plurality of level shifters 118 are electrically coupled to the plurality of fluid actuation devices 104 through a signal path 120. The plurality of level shifters 118 are used to control the plurality of fluid actuation devices 104 and are described in more detail below with reference to FIGS. 1C, 2A, and 2B.

In the example illustrated in FIG. 1B, the plurality of first interconnect pads 122a and 122b are electrically coupled to the high-voltage high-power supply node 106. In other examples, each of the plurality of first interconnect pads 122a and 122b may be electrically coupled to a separate high-voltage high-power supply node, where each separate high-voltage high-power supply node supplies power to a portion of the warming circuits 110 and/or a portion of the fluid actuation devices 104. While two first interconnect pads 122a and 122b are illustrated in FIG. 1B, in other examples, integrated circuit 100b may include more than two first interconnect pads, such as three or four first interconnect pads, electrically coupled to the high-voltage high-power supply node 106. In any case, the number of first interconnect pads is selected such that a high-voltage high-power supply (e.g., VPP) may safely supply power (e.g., by reducing the resistance) to the high-voltage high-power supply node 106 of the integrated circuit 100b by dividing the supplied current over the plurality of first interconnect pads. The second interconnect pad 124 is electrically coupled to the high-voltage low-power supply node 108. The number of second interconnect pads may be less than the number of first interconnect pads. While one second interconnect pad 124 is illustrated in FIG. 1B, in other examples, integrated circuit 100b may include more than one second interconnect pad electrically coupled to the high-voltage low-power supply node 108.

Figure 1C:
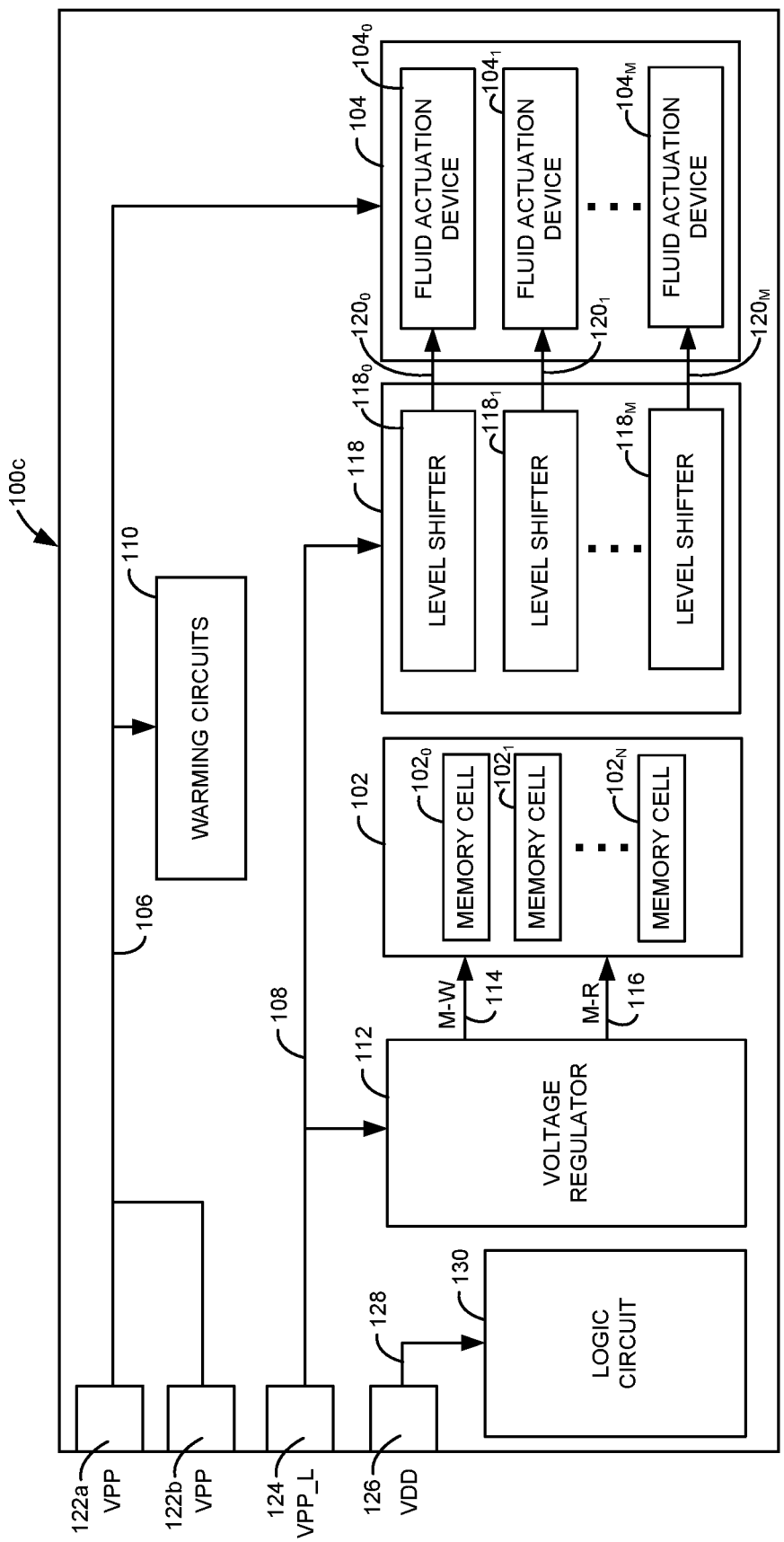
FIG. 1C is a block diagram illustrating another example of an integrated circuit including a plurality of memory cells and a plurality of fluid actuation devices.

FIG. 1C is a block diagram illustrating another example of an integrated circuit 100c (e.g., fluidic die). Integrated circuit 100c includes the plurality of memory cells 102, the plurality of fluid actuation devices 104, the high-voltage high-power supply node 106, the high-voltage low-power supply node 108, the plurality of warming circuits 110, the voltage regulator 112, the plurality of level shifters 118, the plurality of first interconnect pads 122a and 122b, and the second interconnect pad 124 as previously described and illustrated with reference to FIG. 1B. In addition, integrated circuit 100c includes a third interconnect pad 126, a low-voltage low-power supply node 128, and a logic circuit 130.

The third interconnect pad 126 is electrically coupled to the low-voltage low-power supply node 128. The low-voltage low-power supply node 128 may be electrically coupled to a low-voltage low-power supply (e.g., VDD) via the third interconnect pad 126. The low-voltage low-power supply node 128 is to supply a third voltage and a third maximum current. The third voltage is less than the first voltage supplied on the high-voltage high-power supply node 106 and less than the second voltage supplied on the high-voltage low-power supply node 108. The third maximum current is less than the first maximum current supplied on the high-voltage high-power supply node 106. For example, the third voltage may be less than 10V (e.g., 5V), and the third maximum current may be less than 500 mA (e.g., 200 mA).

The logic circuit 130 is to receive power from the low-voltage low-power supply node 128. Logic circuit 130 may control the operation of integrated circuit 100c, including enabling and/or disabling warming circuits of the plurality of warming circuits 110, reading and writing data to the plurality of memory cells 102, enabling and disabling level shifters of the plurality of level shifters 118, and controlling firing of the plurality of fluid actuation devices 104.

In this example, the plurality of level shifters 118 includes level shifters $118_0$ to $118_M$, and the plurality of fluid actuation devices 104 includes fluid actuation devices $104_0$ to $104_M$, where "M" is any suitable number of level shifters and corresponding fluid actuation devices. Each level shifter $118_0$ to $118_M$ of the plurality of level shifters 118 is electrically coupled to a corresponding fluid actuation device $104_0$ to $104_M$ of the plurality of fluid actuation devices 104 through a corresponding signal path $120_0$ to $120_M$.

Figure 2A:
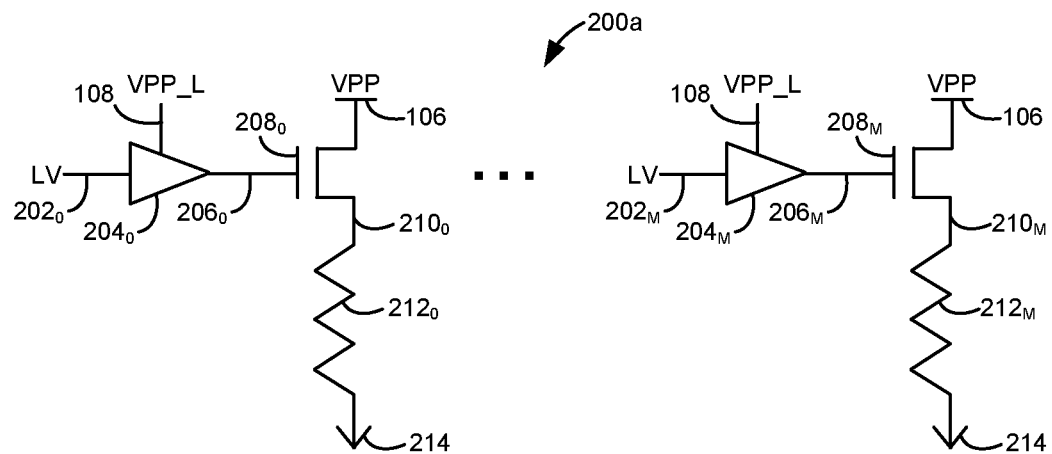
FIG. 2A is a schematic diagram illustrating one example of a high-side switch (HSS) fluid actuation device firing architecture.

FIG. 2A is a schematic diagram illustrating one example of a high-side switch (HSS) fluid actuation device firing architecture 200a. Architecture 200a includes a plurality of level shifters $204_0$ to $204_M$, a plurality of transistors $208_0$ to $208_M$, and a plurality of fluid actuation devices $212_0$ to $212_M$. In one example, the plurality of level shifters $204_0$ to $204_M$ provide the plurality of level shifters $118_0$ to $118_M$ of FIG. 1C, and the plurality of fluid actuation devices $212_0$ to $112_M$ provide the plurality of fluid actuation devices $104_0$ to $104_M$ of FIG. 1C.

A control input of each level shifter $204_0$ to $204_M$ receives a level shifter control signal on a low-voltage (LV) signal path $202_0$ to $202_M$, respectively. In one example, the control signal on each LV signal path $202_0$ to $202_M$ may be provided by logic circuit 130 of FIG. 1C. A supply input of each level shifter $204_0$ to $204_M$ is electrically coupled to the high-voltage low-power supply node 108. The output of each level shifter $204_0$ to $204_M$ is electrically coupled to the gate of a transistor $208_0$ to $208_M$ through a signal path $206_0$ to $206_M$, respectively. One side of the source-drain path of each transistor $208_0$ to $208_M$ is electrically coupled to the high-voltage high-power supply node 106. The other side of the source-drain path of each transistor $208_0$ to $208_M$ is electrically coupled to one side of a fluid actuation device $212_0$ to $212_M$ through a signal path $210_0$ to $210_M$, respectively. The other side of each fluid actuation device $212_0$ to $212_M$ is electrically coupled to a common or ground node 214.

In this example, each fluid actuation device $212_0$ to $210_M$ is a resistive fluid actuation device, such as a thermal inkjet (TIJ) resistor. In other examples, each fluid actuation device $212_0$ to $210_M$ may be a piezo electric device. Each level shifter $204_0$ to $204_M$ may be individually controlled to apply a level shifted signal on the corresponding signal path $206_0$ to $206_M$ to control the corresponding transistor $208_0$ to $208_M$. In response to turning on a corresponding transistor $208_0$ to $208_M$ in response to a control signal on LV signal path $202_0$ to $202_M$, the corresponding fluid actuation device $212_0$ to $212_M$ is fired (i.e., turned on) by applying the high-voltage high-power supply on the high-voltage high-power supply node 106 to the corresponding fluid actuation device $212_0$ to $212_M$.

Figure 2B:
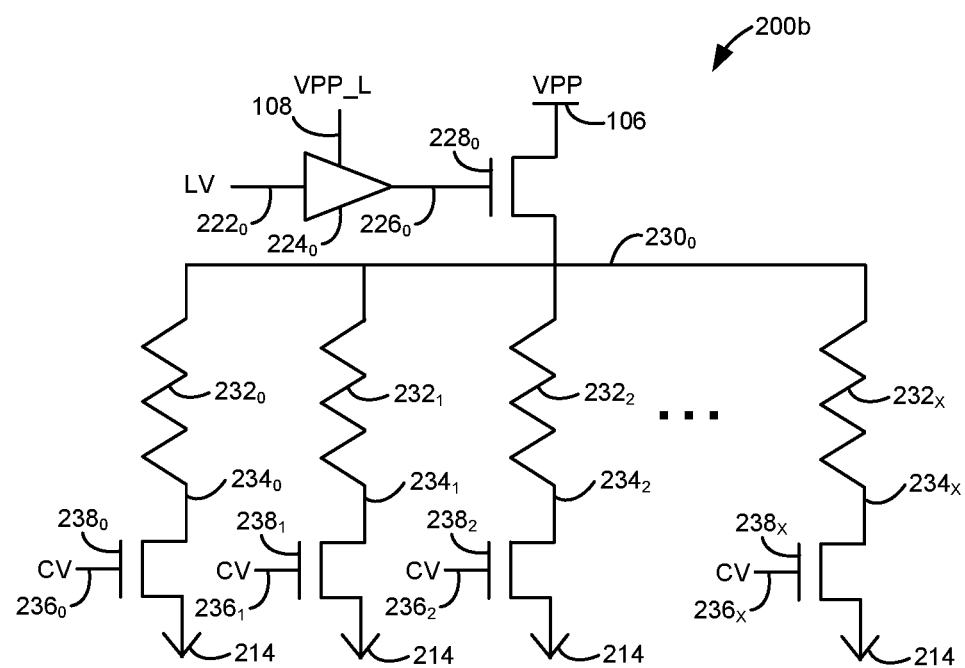
FIG. 2B is a schematic diagram illustrating one example of a hybrid HSS fluid actuation device firing architecture.

FIG. 2B is a schematic diagram illustrating one example of a hybrid HSS fluid actuation device firing architecture 200b. The illustrated architecture 200b may be used for one group (i.e., subset) of the plurality of fluid actuation devices 104 of FIG. 1B and repeated for other groups of the plurality of fluid actuation devices 104. Architecture 200b includes a level shifter $224_0$ for a first group, a first transistor $228_0$ for the first group, a plurality of fluid actuation devices $232_0$ to $232_X$ for the first group, and a plurality of second transistors $238_0$ to $238_X$ for the first group, where "X" is any suitable number of fluid actuation devices in the first group.

A control input of level shifter $224_0$ receives a level shifter control signal on a LV signal path $222_0$. In one example, the control signal on LV signal path $222_0$ may be provided by logic circuit 130 of FIG. 1C. A supply input of level shifter $224_0$ is electrically coupled to the high-voltage low-power supply node 108. The output of level shifter $224_0$ is electrically coupled to the gate of the first transistor $228_0$ through a signal path $226_0$. One side of the source-drain path of transistor $228_0$ is electrically coupled to the high-voltage high-power supply node 106. The other side of the source-drain path of transistor $228_0$ is electrically coupled to one side of each fluid actuation device $232_0$ to $232_X$ through a signal path $230_0$. The other side of each fluid actuation device $232_0$ to $232_X$ is electrically coupled to one side of the source-drain path of a second transistor $238_0$ to $238_X$ through a signal path $234_0$ to $234_X$, respectively. The gate of each second transistor $238_0$ to $238_X$ receives a control signal through a control voltage (CV) signal path $236_0$ to $236_X$, respectively. In one example, each control signal on signal paths $236_0$ to $236_X$ may be provided by logic circuit 130 of FIG. 1C. The other side of the source-drain path of each second transistor $238_0$ to $238_X$ is electrically coupled to a common or ground node 214.

In this example, each fluid actuation device $232_0$ to $232_X$ is a resistive fluid actuation device, such as a thermal inkjet (TIJ) resistor. In other examples, each fluid actuation device $232_0$ to $230_X$ may be a piezo electric device. Level shifter $224_0$ may be controlled to apply a level shifted signal on the signal path $226_0$ to control the first transistor $228_0$. Each second transistor $238_0$ to $238_X$ may be individually controlled to turn each second transistor $238_0$ to $238_X$ on or off. In response to turning on the first transistor $228_0$ and a second transistor $238_0$ to $238_X$, the corresponding fluid actuation device $232_0$ to $232_X$ is fired (i.e., turned on) by applying the high-voltage high-power supply on the high-voltage high-power supply node 106 to the corresponding fluid actuation device $232_0$ to $232_X$.

Figure 3A:
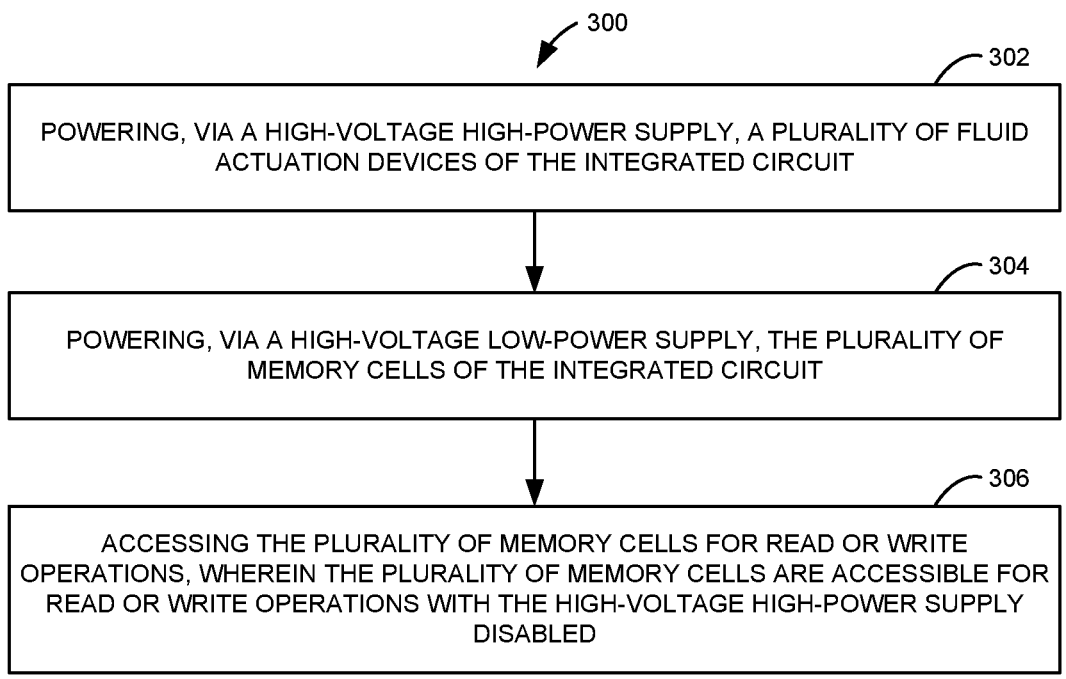
FIGS. 3A-3C are flow diagrams illustrating examples of a method for accessing a plurality of memory cells of an integrated circuit.
Figure 3B:
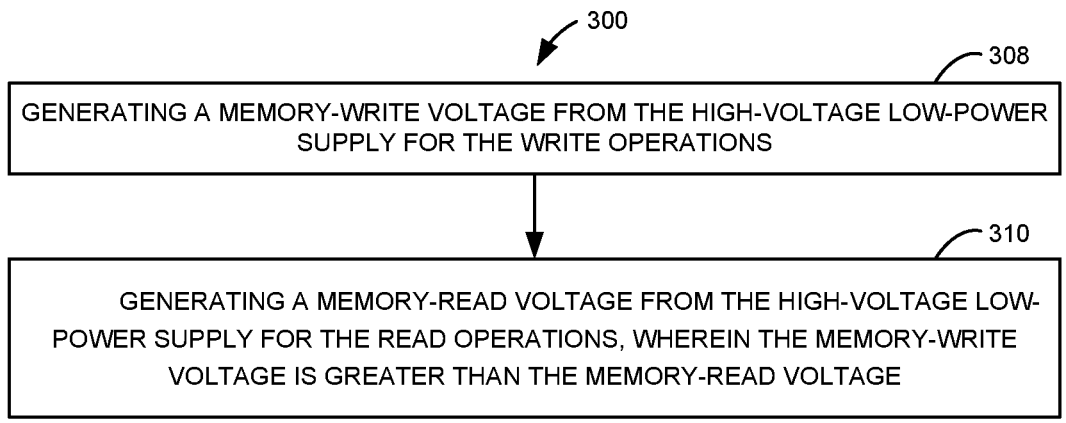
Figure 3C:
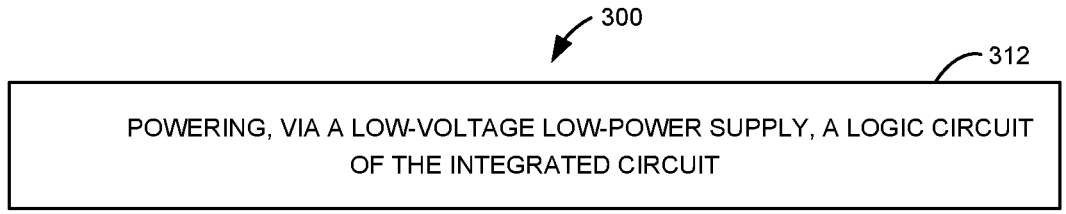

FIGS. 3A-3C are flow diagrams illustrating examples of a method 300 for accessing a plurality of memory cells (e.g., 102) of an integrated circuit (e.g., 100a, 100b, or 100c). As illustrated in FIG. 3A at 302, method 300 includes powering, via a high-voltage high-power supply (e.g., VPP), a plurality of fluid actuation devices (e.g., 104) of the integrated circuit. At 304, method 300 includes powering, via a high-voltage low-power supply (e.g., VPP_L), the plurality of memory cells of the integrated circuit. At 306, method 300 includes accessing the plurality of memory cells for read or write operations (e.g., via logic circuit 130), wherein the plurality of memory cells are accessible for read or write operations with the high-voltage high-power supply disabled.

As illustrated in FIG. 3B at 308, method 300 may further include generating a memory-write voltage (e.g., via voltage regulator 112) from the high-voltage low-power supply for the write operations. At 310, method 300 may further include generating a memory-read voltage (e.g., via voltage regulator 112) from the high-voltage low-power supply for the read operations, wherein the memory-write voltage is greater than the memory-read voltage. As illustrated in FIG. 3C at 312, method 300 may further include powering, via a low-voltage low-power supply (e.g., VDD), a logic circuit (e.g., 130) of the integrated circuit.

Figure 4:
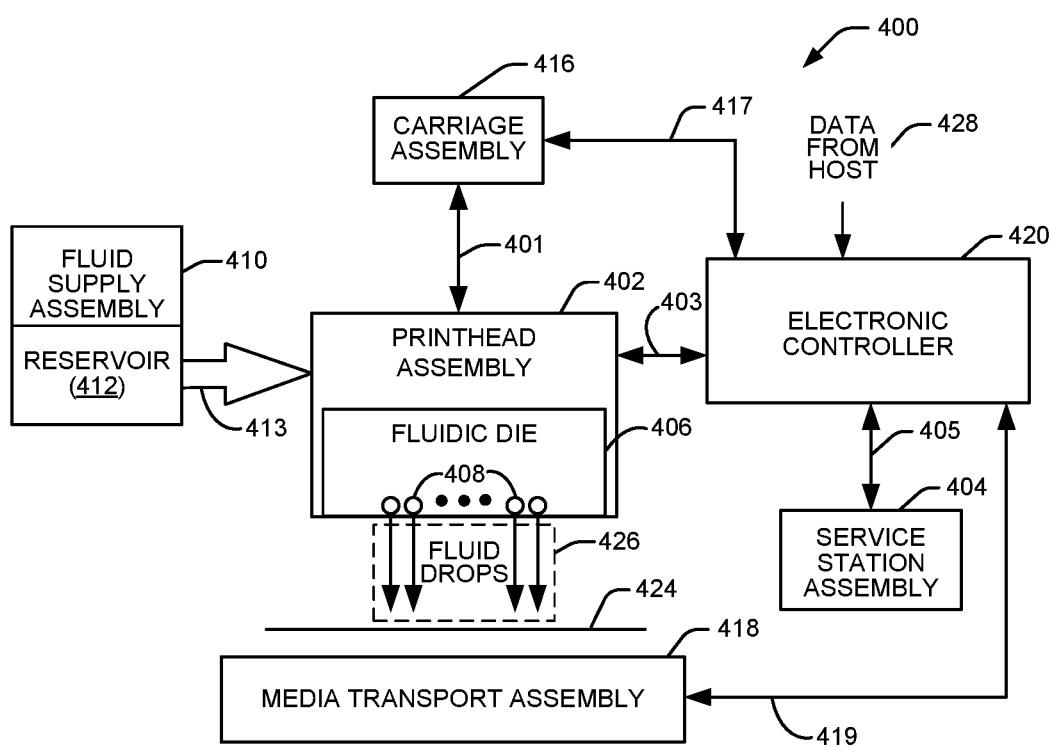
FIG. 4 is a block diagram illustrating one example of a fluid ejection system.

FIG. 4 is a block diagram illustrating one example of a fluid ejection system 400. Fluid ejection system 400 includes a fluid ejection assembly, such as printhead assembly 402, and a fluid supply assembly 410, such as an ink supply assembly. In the illustrated example, fluid ejection system 400 also includes a service station assembly 404, a carriage assembly 416, a print media transport assembly 418, and an electronic controller 420. While the following description provides examples of systems and assemblies for fluid handling with regard to ink, the disclosed systems and assemblies are also applicable to the handling of fluids other than ink.

Printhead assembly 402 includes a single printhead or fluidic die 406 or multiple printheads or fluidic die 406 including fluid actuation devices (e.g., ejecting actuators or non-ejecting actuators, such as micro-fluidic pumps to move fluid in microfluidic channels). In one example, fluidic die 406 may be provided by integrated circuit 100a, 100b, or 100c previously described and illustrated with reference to FIGS. 1A-1C. The fluidic die 406 may eject drops of ink or fluid through a plurality of orifices or nozzles 408. In one example, the drops are directed toward a medium, such as print media 424, so as to print onto print media 424. In one example, print media 424 includes any type of suitable sheet material, such as paper, card stock, transparencies, Mylar, fabric, and the like. In another example, print media 424 includes media for three-dimensional (3D) printing, such as a powder bed, or media for bioprinting, drug discovery testing, and/or other life-science applications, such as a reservoir, a container, or receptacles. In one example, nozzles 408 are arranged in a single column or array or multiple columns or arrays such that properly sequenced ejection of fluid from nozzles 408 causes characters, symbols, and/or other graphics or images to be printed upon print media 424 as printhead assembly 402 and print media 424 are moved relative to each other.

Fluid supply assembly 410 supplies fluid (e.g., ink) to printhead assembly 402 and includes a reservoir 412 for storing fluid. As such, in one example, fluid flows from reservoir 412 to printhead assembly 402. In one example, printhead assembly 402 and fluid supply assembly 410 are housed together in an inkjet or fluid-jet print cartridge or pen. In another example, fluid supply assembly 410 is separate from printhead assembly 402 and supplies fluid to printhead assembly 402 through an interface connection 413, such as a supply tube and/or valve.

Carriage assembly 416 positions printhead assembly 402 relative to print media transport assembly 418, and print media transport assembly 418 positions print media 424 relative to printhead assembly 402. Thus, a print zone 426 is defined adjacent to nozzles 408 in an area between printhead assembly 402 and print media 424. In one example, printhead assembly 402 is a scanning type printhead assembly such that carriage assembly 416 moves printhead assembly 402 relative to print media transport assembly 418. In another example, printhead assembly 402 is a non-scanning type printhead assembly such that carriage assembly 416 fixes printhead assembly 402 at a prescribed position relative to print media transport assembly 418.

Service station assembly 404 provides for spitting, wiping, capping, and/or priming of printhead assembly 402 to maintain the functionality of printhead assembly 402 and, more specifically, nozzles 408. For example, service station assembly 404 may include a rubber blade or wiper which is periodically passed over printhead assembly 402 to wipe and clean nozzles 408 of excess fluid. In addition, service station assembly 404 may include a cap that covers printhead assembly 402 to protect nozzles 408 from drying out during periods of non-use. In addition, service station assembly 404 may include a spittoon into which printhead assembly 402 ejects fluid during spits to ensure that reservoir 412 maintains an appropriate level of pressure and fluidity, and to ensure that nozzles 408 do not clog or weep. Functions of service station assembly 404 may include relative motion between service station assembly 404 and printhead assembly 402.

Electronic controller 420 communicates with printhead assembly 402 through a communication path 403, service station assembly 404 through a communication path 405, carriage assembly 416 through a communication path 417, and print media transport assembly 418 through a communication path 419. In one example, when printhead assembly 402 is mounted in carriage assembly 416, electronic controller 420 and printhead assembly 402 may communicate via carriage assembly 416 through a communication path 401. Electronic controller 420 may also communicate with fluid supply assembly 410 such that, in one implementation, a new (or used) fluid supply may be detected.

Electronic controller 420 receives data 428 from a host system, such as a computer, and may include memory for temporarily storing data 428. Data 428 may be sent to fluid ejection system 400 along an electronic, infrared, optical or other information transfer path. Data 428 represent, for example, a document and/or file to be printed. As such, data 428 form a print job for fluid ejection system 400 and includes a single print job command and/or command parameter or multiple print job commands and/or command parameters.

In one example, electronic controller 420 provides control of printhead assembly 402 including timing control for ejection of fluid drops from nozzles 408. As such, electronic controller 420 defines a pattern of ejected fluid drops which form characters, symbols, and/or other graphics or images on print media 424. Timing control and, therefore, the pattern of ejected fluid drops, is determined by the print job commands and/or command parameters. In one example, logic and drive circuitry forming a portion of electronic controller 420 is located on printhead assembly 402. In another example, logic and drive circuitry forming a portion of electronic controller 420 is located off printhead assembly 402.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. An integrated circuit comprising:
   a plurality of fluid actuation devices;
   a plurality of memory cells;
   a high-voltage high-power supply node to supply a first voltage and a first maximum current to the plurality of fluid actuation devices; and
   a high-voltage low-power supply node to supply a second voltage and a second maximum current to the plurality of memory cells.

2. The integrated circuit of claim 1, wherein the first voltage and the second voltage are greater than 10V, and the first maximum current is at least three times the second maximum current.

3. The integrated circuit of claim 1, further comprising:
   a plurality of level shifters, each level shifter of the plurality of level shifters electrically coupled to a corresponding fluid actuation device of the plurality of fluid actuation devices, wherein the high-voltage low-power supply node is to supply the second voltage to the plurality of level shifters.

4. The integrated circuit of claim 1, further comprising:
a plurality of warming circuits,
wherein the high-voltage high-power supply node is to supply the first voltage to the plurality of warming circuits.

5. The integrated circuit of claim 1, further comprising:
a plurality of first interconnect pads electrically coupled to the high-voltage high-power supply node; and
a second interconnect pad electrically coupled to the high-voltage low-power supply node,
wherein a number of second interconnect pads is less than a number of first interconnect pads.

6. The integrated circuit of claim 1, wherein the plurality of memory cells are readable with the high-voltage high-power supply node disabled.

7. The integrated circuit of claim 1, wherein the first maximum current is greater than 1 A.

8. The integrated circuit of claim 1, wherein the second maximum current is less than 1 A.

9. The integrated circuit of claim 1, further comprising:
a voltage regulator to receive the second voltage and generate a memory-write voltage to write data to the plurality of memory cells and a memory-read voltage to read data from the plurality of memory cells,
wherein the memory-write voltage is greater than the memory-read voltage.

10. A fluidic die comprising:
a high-voltage high-power supply node to supply a first voltage and a first maximum current;
a high-voltage low-power supply node to supply a second voltage and a second maximum current;
a low-voltage low-power supply node to supply a third voltage and a third maximum current;
a plurality of fluid actuation devices to receive power from the high-voltage high-power supply node;
a plurality of memory cells to receive power from the high-voltage low-power supply node; and
a logic circuit to receive power from the low-voltage low-power supply node.

11. The fluidic die of claim 10, wherein the first maximum current is greater than 1 A, the second maximum current is less than 1 A, and the third maximum current is less than 500 mA.

12. The fluidic die of claim 10, wherein the plurality of memory cells comprise non-volatile memory cells.

13. A method for accessing a plurality of memory cells of an integrated circuit, the method comprising:
powering, via a high-voltage high-power supply, a plurality of fluid actuation devices of the integrated circuit;
powering, via a high-voltage low-power supply, the plurality of memory cells of the integrated circuit; and
accessing the plurality of memory cells for read or write operations, wherein the plurality of memory cells are accessible for read or write operations with the high-voltage high-power supply disabled.

14. The method of claim 13, further comprising:
generating a memory-write voltage from the high-voltage low-power supply for the write operations; and
generating a memory-read voltage from the high-voltage low-power supply for the read operations,
wherein the memory-write voltage is greater than the memory-read voltage.

15. The method of claim 13, further comprising:
powering, via a low-voltage low-power supply, a logic circuit of the integrated circuit.

* * * * *